United States Patent
Dickie et al.

(10) Patent No.: US 8,786,514 B2
(45) Date of Patent: *Jul. 22, 2014

(54) SYSTEM AND METHOD FOR PAYLOAD ENCLOSURE

(71) Applicant: Redline Communications Inc., Markham (CA)

(72) Inventors: Robert Gerald Dickie, King (CA); Bojan Subasic, Mississauga (CA); Rodney Edward Cronin, Aurora (CA)

(73) Assignee: Redline Communications Inc., Markham (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/013,581

(22) Filed: Aug. 29, 2013

(65) Prior Publication Data

US 2014/0062830 A1    Mar. 6, 2014

Related U.S. Application Data

(63) Continuation of application No. 13/600,672, filed on Aug. 31, 2012, now Pat. No. 8,564,497.

(51) Int. Cl.
| | |
|---|---|
| *H01Q 1/42* | (2006.01) |
| *H01Q 3/00* | (2006.01) |
| *H01Q 1/12* | (2006.01) |
| *H01Q 3/04* | (2006.01) |
| *H04B 1/08* | (2006.01) |
| *H01Q 21/08* | (2006.01) |
| *H05K 1/02* | (2006.01) |

(52) U.S. Cl.
CPC . *H01Q 1/42* (2013.01); *H01Q 1/12* (2013.01); *H05K 1/0243* (2013.01); *H01Q 3/04* (2013.01); *H04B 1/08* (2013.01); *H01Q 21/08* (2013.01)
USPC ........... 343/872; 343/720; 343/758; 343/763; 343/890

(58) Field of Classification Search
CPC .......... H01Q 1/42; H01Q 1/12; H01Q 1/1242
USPC .......................... 343/872, 720, 758, 763, 890
See application file for complete search history.

(56) References Cited

U.S. PATENT DOCUMENTS

| | | | |
|---|---|---|---|
| 6,351,643 B1 | 2/2002 | Haartsen | 455/450 |
| 6,501,785 B1 | 12/2002 | Chang et al. | 375/133 |
| 7,116,700 B1 | 10/2006 | Sivakumar | 375/132 |
| D655,278 S | 3/2012 | Thomson et al. | D14/230 |
| 8,134,519 B2 | 3/2012 | Tominaga et al. | 343/906 |

(Continued)

*Primary Examiner* — Robert Karacsony
(74) *Attorney, Agent, or Firm* — Nixon Peabody LLP

(57) ABSTRACT

A cylindrical-shaped enclosure having tapered ends. The enclosure includes a module having a radio disposed on a printed circuit board and an antenna connected to the PCB. The enclosure has a main piece coupled to a lower piece and to a top piece, an optionally a fourth piece coupled to the top piece. A mounting subsystem is mounted to the main piece and includes a hole configured to receive therethrough a wires that connect to the printed circuit board. The antenna is configured to rotate about an axis that extends along a longest dimension of the enclosure. The module includes a metal plate to which the antenna is directly mechanically and electrically coupled without any cable such that the wires lack any control signals for controlling the antenna. The top and/or lower pieces can house any combination of a camera, an environmental sensor, security equipment, or a lighting system.

20 Claims, 21 Drawing Sheets

(56) References Cited

U.S. PATENT DOCUMENTS

| | | | |
|---|---|---|---|
| 8,138,982 B1 | 3/2012 | West et al. | 343/705 |
| 8,138,986 B2 | 3/2012 | McMahon | 343/817 |
| 8,149,177 B1 | 4/2012 | Callus et al. | 343/771 |
| 8,154,452 B2 | 4/2012 | Webb | 342/368 |
| 8,154,462 B2 | 4/2012 | Puente Baliarda et al. | 343/702 |
| 8,154,463 B2 | 4/2012 | Baliarda et al. | 343/702 |
| 8,159,394 B2 | 4/2012 | Hayes et al. | 342/368 |
| 8,159,403 B1 | 4/2012 | Chen et al. | 343/705 |
| 8,159,409 B2 | 4/2012 | Harokopus et al. | 343/872 |
| 8,164,540 B2 | 4/2012 | Saddington et al. | 343/872 |
| 8,168,264 B2 | 5/2012 | Brown | 427/508 |
| 8,168,292 B2 | 5/2012 | Morin | 428/300.4 |
| 8,169,378 B2 | 5/2012 | Barson et al. | 343/705 |
| 8,172,422 B2 | 5/2012 | Kim | 362/234 |
| 8,174,432 B2 | 5/2012 | Kawasaki et al. | 342/70 |
| 8,174,442 B2 | 5/2012 | Haskell | 342/373 |
| 8,174,461 B1 | 5/2012 | Smith | 343/881 |
| 8,175,648 B2 | 5/2012 | Johnson et al. | 455/562.1 |
| 8,175,758 B2 | 5/2012 | Mouton | 701/3 |
| 8,178,606 B2 | 5/2012 | Sang et al. | 524/403 |
| 8,179,327 B1 | 5/2012 | Clark et al. | 343/709 |
| 8,184,061 B2 | 5/2012 | Sanford | 343/773 |
| 8,184,064 B2 | 5/2012 | Sanford | 343/872 |
| 8,185,161 B2 | 5/2012 | Haskell et al. | 455/562.1 |
| 8,188,908 B2 | 5/2012 | Landt | 342/51 |
| 8,188,918 B2 | 5/2012 | Surittikul et al. | 343/374 |
| 8,188,935 B2 | 5/2012 | Saddington et al. | 343/872 |
| 8,193,989 B2 | 6/2012 | Fujita et al. | 343/700 |
| 8,193,996 B2 | 6/2012 | Wu et al. | 343/872 |
| 8,194,306 B2 | 6/2012 | Turner et al. | 359/305 |
| 8,195,305 B2 | 6/2012 | Nghiem et al. | 607/60 |
| 8,199,064 B2 | 6/2012 | Semonov et al. | 343/818 |
| 8,203,500 B2 | 6/2012 | Honda et al. | 343/824 |
| 8,203,501 B2 * | 6/2012 | Kim | 343/890 |
| 8,204,432 B2 | 6/2012 | Girard et al. | 455/3.02 |
| 8,204,438 B2 | 6/2012 | Patel et al. | 455/41.2 |
| 8,205,536 B2 | 6/2012 | Fisher | 89/1.11 |
| 8,207,900 B1 | 6/2012 | Apgar | 343/704 |
| 8,208,962 B2 | 6/2012 | Thomas | 455/562.1 |
| RE43,498 E | 7/2012 | Bekey | 343/912 |
| 8,217,848 B2 | 7/2012 | Girard et al. | 3/766 |
| 8,221,870 B2 | 7/2012 | Brown | 428/156 |
| 8,228,238 B2 | 7/2012 | Thiam et al. | 343/700 |
| 8,228,253 B2 | 7/2012 | Berejik | 343/761 |
| 8,228,259 B2 | 7/2012 | Hager | 343/890 |
| 8,228,840 B2 | 7/2012 | Skarby | 370/328 |
| 8,229,605 B2 | 7/2012 | Vlad | 701/3 |
| 8,564,497 B1 * | 10/2013 | Dickie et al. | 343/872 |
| 2006/0098715 A1 | 5/2006 | Amano | 375/132 |
| 2007/0138275 A1 * | 6/2007 | Hall | 235/400 |
| 2012/0154239 A1 * | 6/2012 | Bar-Sade et al. | 343/839 |

* cited by examiner

SYSTEM AND METHOD FOR PAYLOAD ENCLOSURE

CROSS REFERENCE TO RELATED APPLICATIONS

This application is a continuation of pending U.S. application Ser. No. 13/600,672, filed Aug. 31, 2012, which is incorporated herein by reference in its entirety.

BACKGROUND OF THE INVENTION

There is an ever growing need for wireless services to be provided around a variety of structures, including, for example, office buildings, historical structures, recreational structures, shopping malls and complexes, apartment and condominium complexes and hotel and resort complexes.

Frequently, architects and designers work to ensure that these buildings are aesthetically pleasing. However, most radio equipment to provide wireless services is not designed with aesthetics in mind. Rather, this equipment is designed to be functional, with little to no attention paid to aesthetics.

When this equipment is placed in or on top or on the sides of buildings, they can diminish the aesthetic value of such buildings. Therefore, it is important to place this equipment in enclosures which do not diminish or reduce the aesthetic value of such buildings.

DESCRIPTION OF THE INVENTION

This specification details a system and a method for an aesthetically pleasing enclosure to house a payload. Payloads can include, but are not limited to, combinations of radio equipment and antennae; lighting systems and security systems.

Figure 1:
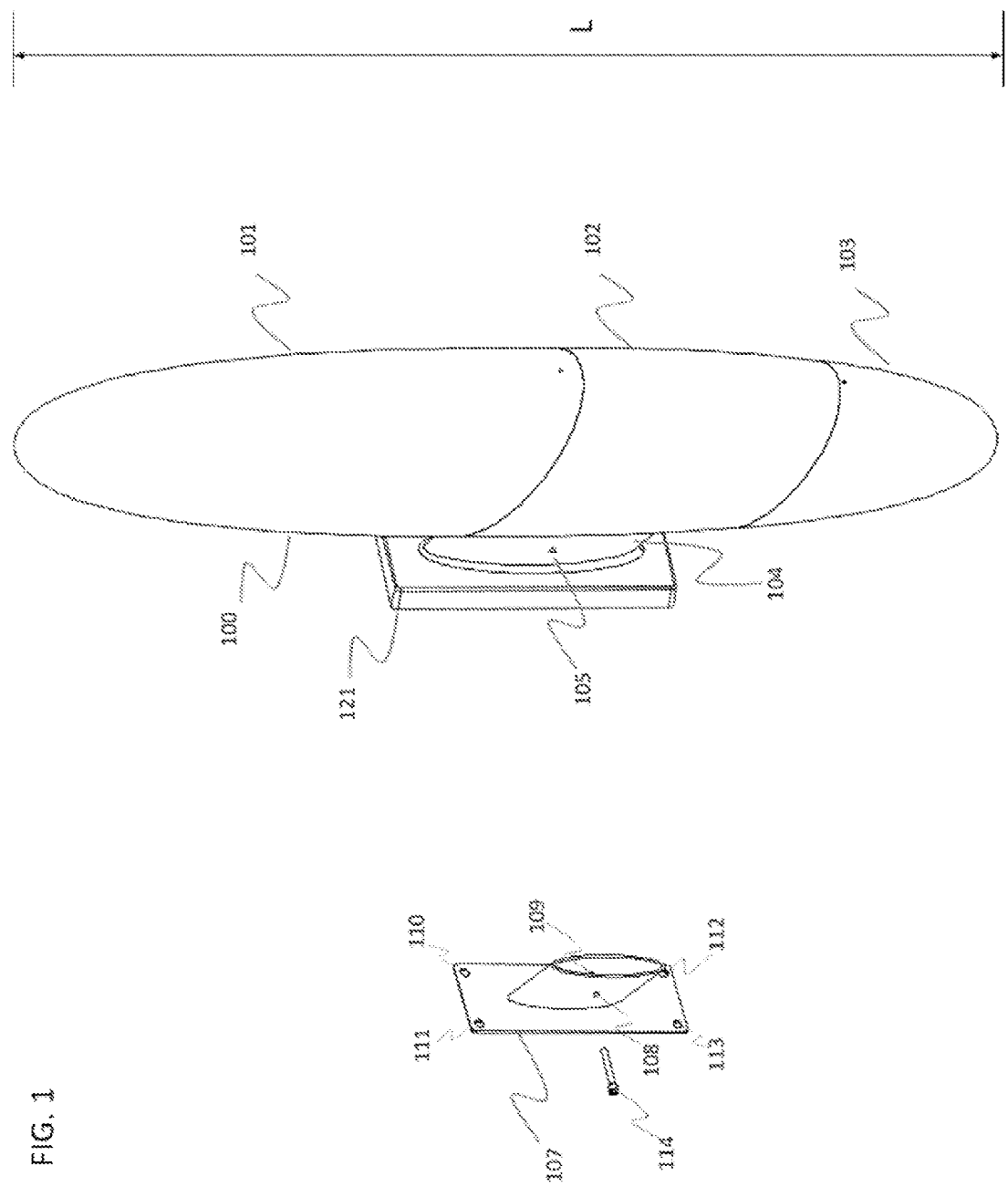
FIG. 1 shows a perspective view from a front of an enclosure.
Figure 2:
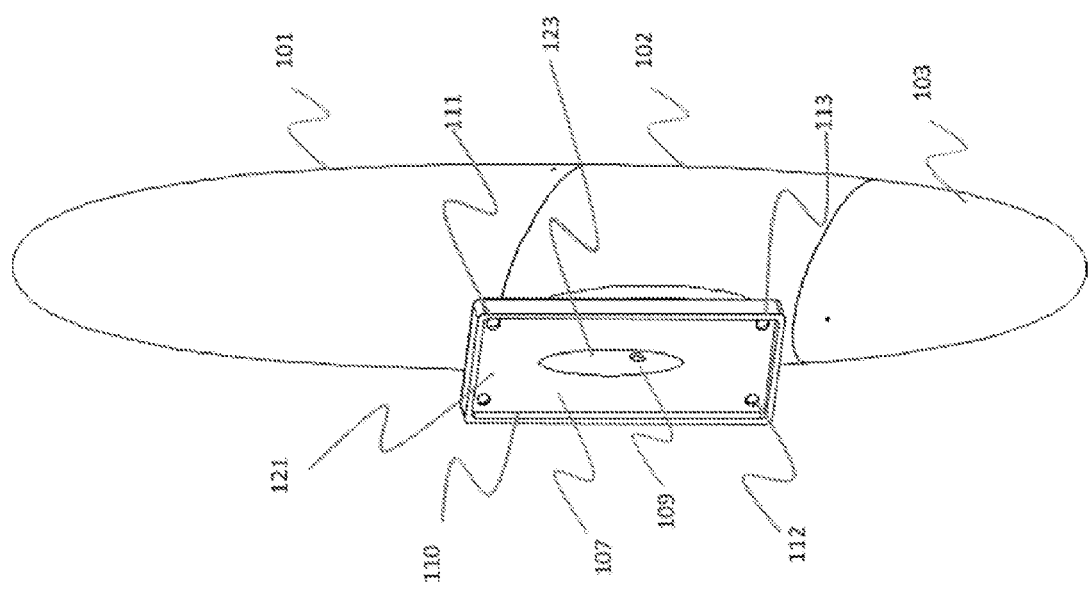
FIG. 2 shows a perspective view from a rear of the enclosure shown in FIG. 1.

In one embodiment, as is shown in FIG. 1 and FIG. 2, the enclosure 100 is cylindrical with tapered ends. Novel form factors such as the one shown in FIGS. 1 and 2 give the enclosure enhanced aesthetic value over enclosures in the prior art. Using tapered ends discourages birds from nesting on the enclosure. Nesting birds can degrade the performance of radio equipment, due to, for example, bird droppings and nesting material. Thus using such a shape can help improve the performance of radio equipment within. The tapered ends can be rounded to form a sleek, continuous surface body free from any sharp transitions.

Furthermore, the cylindrical shape of the enclosure assists in dissipating heat produced by the radio equipment within. Also, it allows antennas within the enclosure to freely rotate. Using a cylindrical shape also helps reduce the wind-loading on the enclosure.

FIG. 1 shows a perspective view of the enclosure 100 from the front, and FIG. 2 shows a perspective view from the rear.

Figure 7:
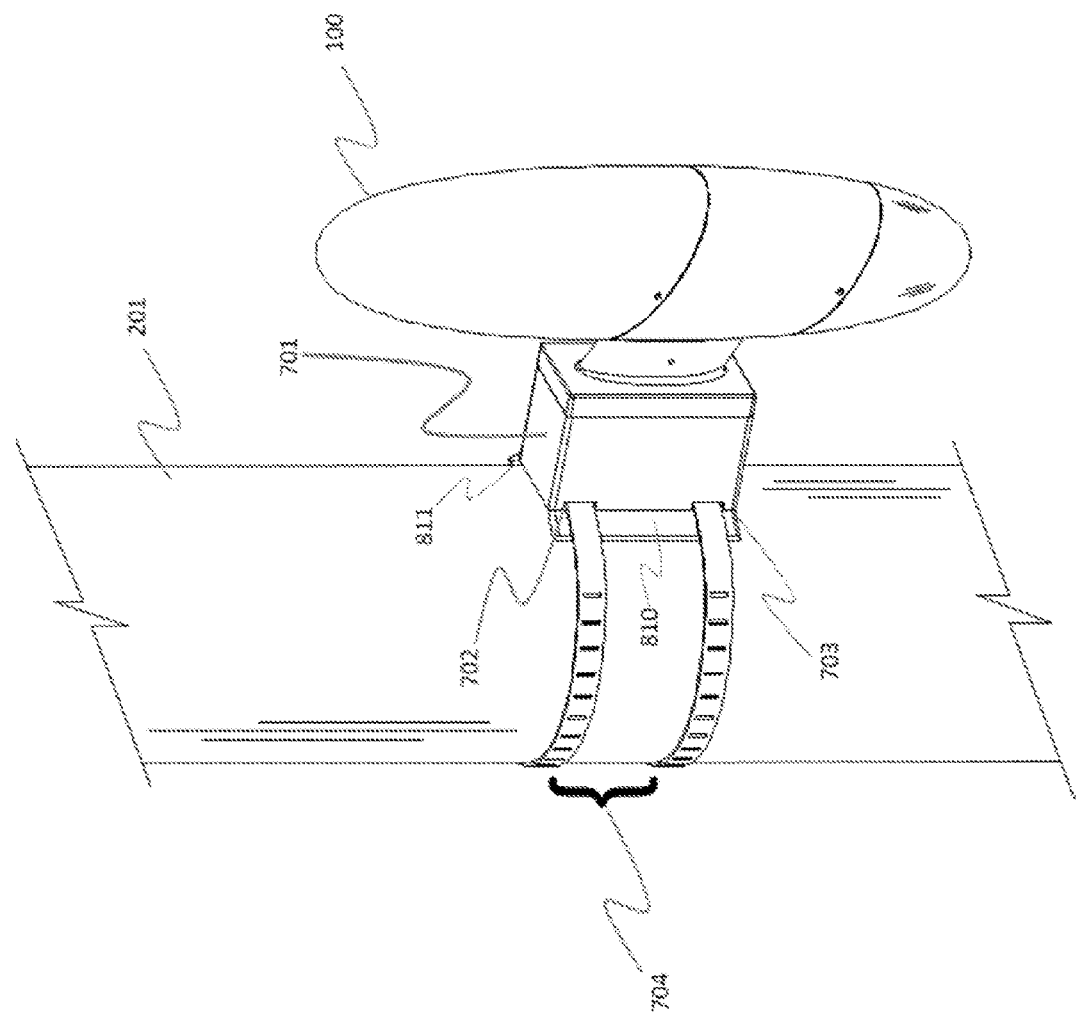
FIG. 7 shows a die cast mount for mounting the enclosure on a pole-like structure.

The enclosure 100 has a plurality of sections or pieces (e.g., separate and distinct from one another but which together form a singular body when assembled or coupled together). FIG. 1 and FIG. 2 show one embodiment of the enclosure with 3 sections. There is a top section 101; main or middle section 102; and lower section 103. While an enclosure with 3 sections is depicted here, the number of sections in the enclosure is not limited to 3. The enclosure is weather proof and is serviceable. In some aspects, the lower section 103 is the section of the enclosure 100 pointing down toward earth when the enclosure 100 is mounted to a fixed structure, such as shown in FIG. 7.

The top section 101 is made of a material which is suitable for outdoor applications and is transparent to radio frequency (RF) waves. Top section 101 can be for example, a tapered cone, or a cylinder. The main section 102 can be, for example, injection plastic or die cast metal. Lower section 103 can be die cast metal, plastic, clear or frosted. It can be, for example, a tapered cone or cylinder; or a clear lens.

Figure 3:
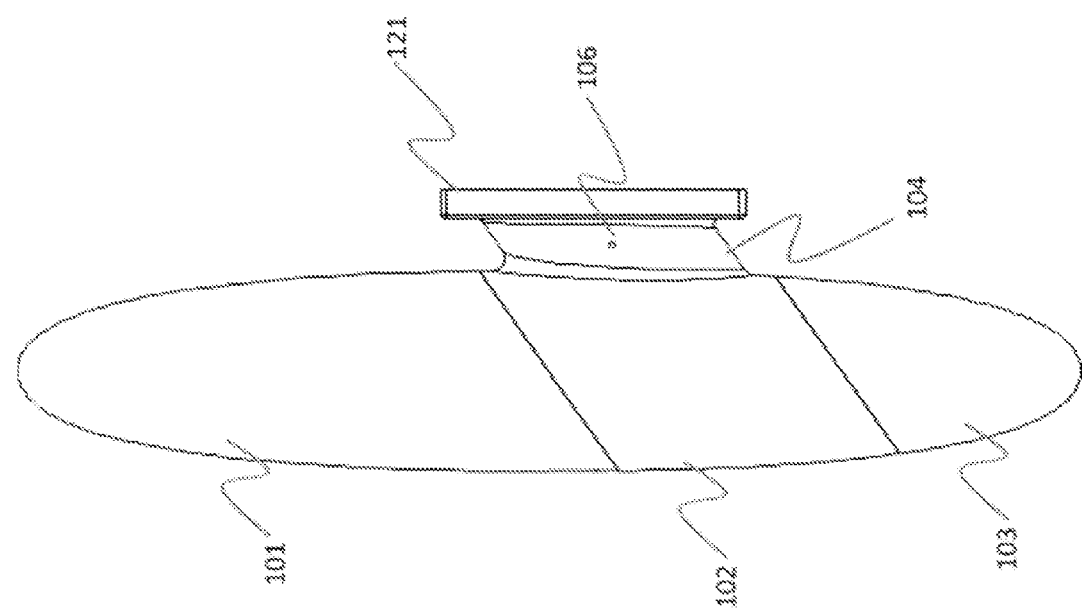
FIG. 3 shows a side view of the enclosure shown in FIG. 1.
Figure 4:
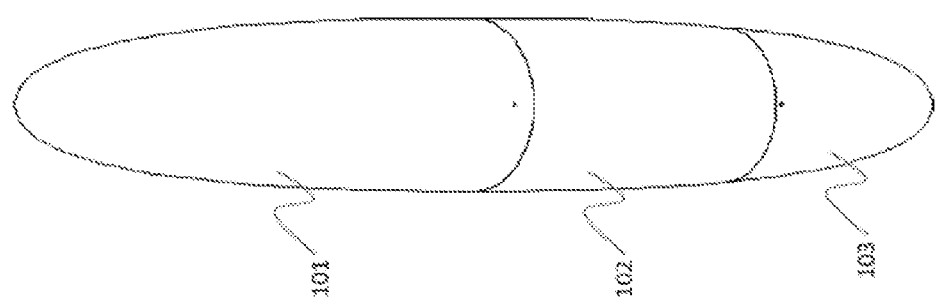
FIG. 4 shows a front view of the enclosure shown in FIG. 1.
Figure 5:
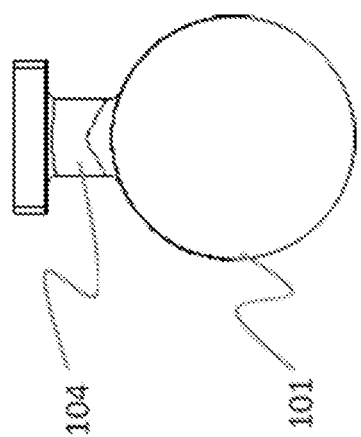
FIG. 5 shows a top view of the enclosure shown in FIG. 1.

FIGS. 3, 4 and 5 show side, front and top views of enclosure 100.

Figure 6:
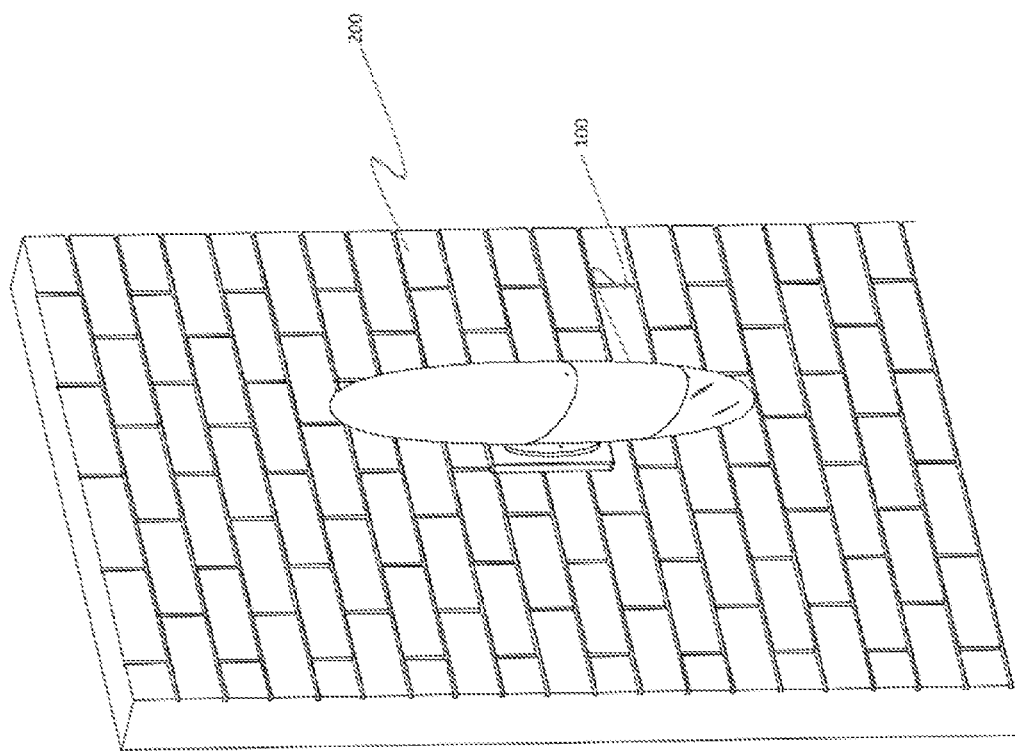
FIG. 6 shows the enclosure of FIG. 1 mounted to a building wall.

There are different mounting subsystems possible. As shown in FIGS. 1, 2 and 3, in one embodiment, the main section 102 contains a sleeve 104 with bolt holes 105 and 106 (bolt hole 106 is shown in FIG. 3) on either side to engage with mounting plate 107 which has a collar with pre-drilled holes 108 and 109. The mounting plate 107 can be rectangular, circular or even oval-shaped. The mounting plate contains holes 110-113 for bolting to a fixed structure, such as a building wall 200 as shown in FIG. 6. The enclosure 100 containing a payload can be pushed onto mounting plate 107, with bolt holes 105 and 106 aligned with pre-drilled holes 108 and 109. Bolt 114 can then be used to secure the enclosure 100 to the mounting plate 107.

Electrical power and data wiring can be fed through a hole 123 accessible from a bottom or base of the mounting subsystem 121 and into the sleeve 104. This ensures that there is no visible wiring (i.e., visible from an exterior of the enclosure 100 when the mounting subsystem of the enclosure 100 is mounted to a fixed structure). With the lower section 103 removed, wiring can be fed through the main section 102.

FIG. 7 shows another embodiment of a mounting subsystem 701, which is an optional die cast mount that can be connected to the mounting plate 107. The die cast mount of the mounting subsystem 701 contains openings such as 702 and 703 to allow steel straps 704 to be used to connect the enclosure 100 to, for example, a pole-like structure 201. The die cast mount of the mounting subsystem 701 has flanges 810 and 811, which can be removed for mounting to a building wall, such as wall 200 of FIG. 6. Normally there would also be a plate to cover the opening at the rear. An example of mounting to light pole 202 is shown in FIG. 8.

Figure 8:
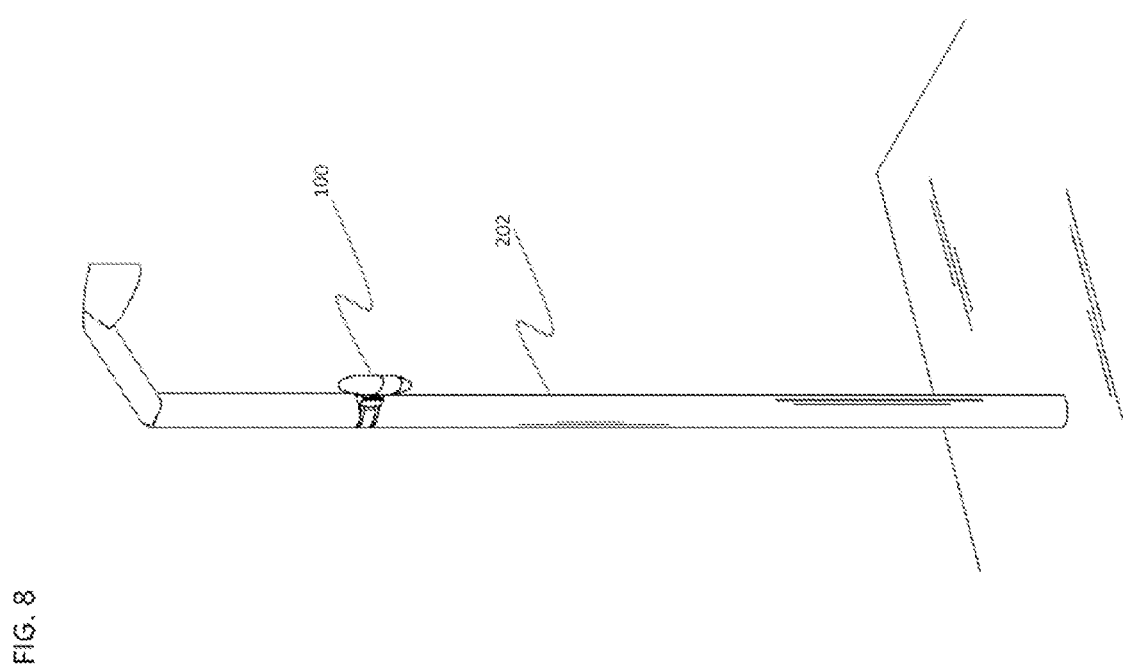
FIG. 8 shows the enclosure mounted on a light pole.
Figure 9:
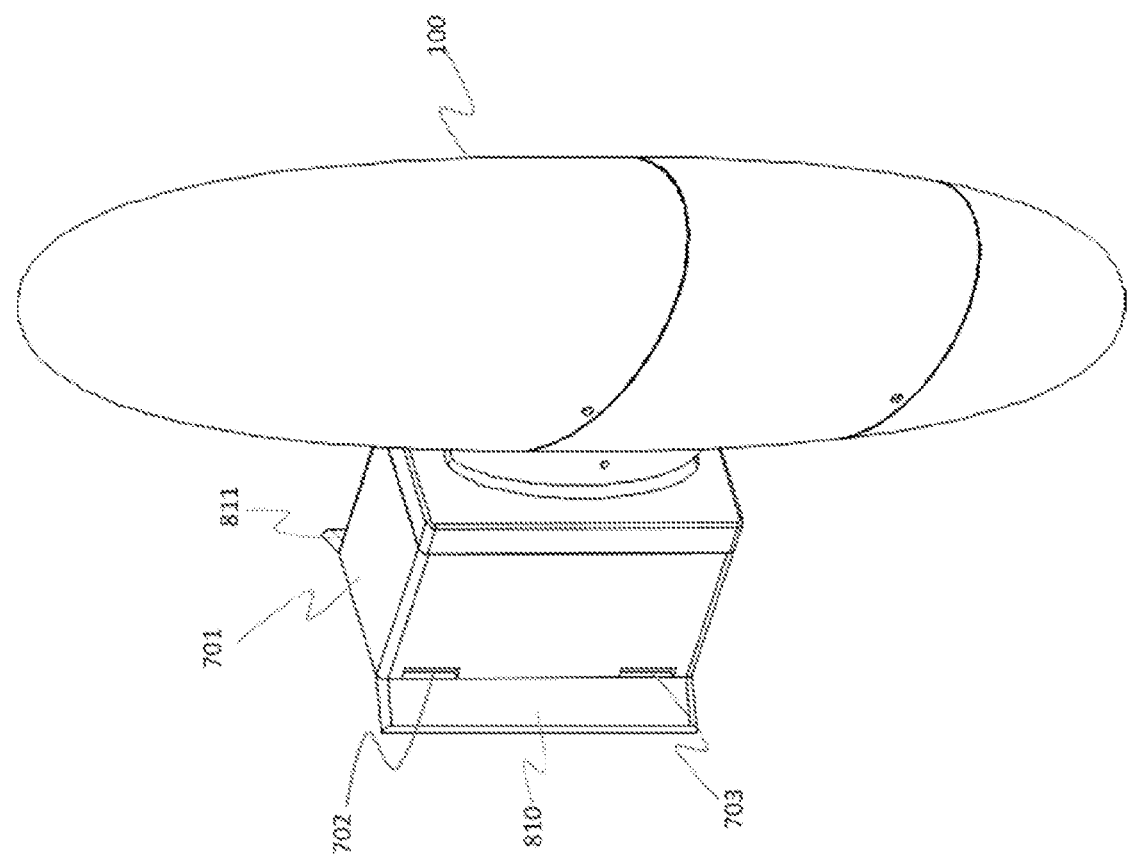
FIG. 9 shows a die cast mount to house a power converter for the enclosure.
Figure 10:
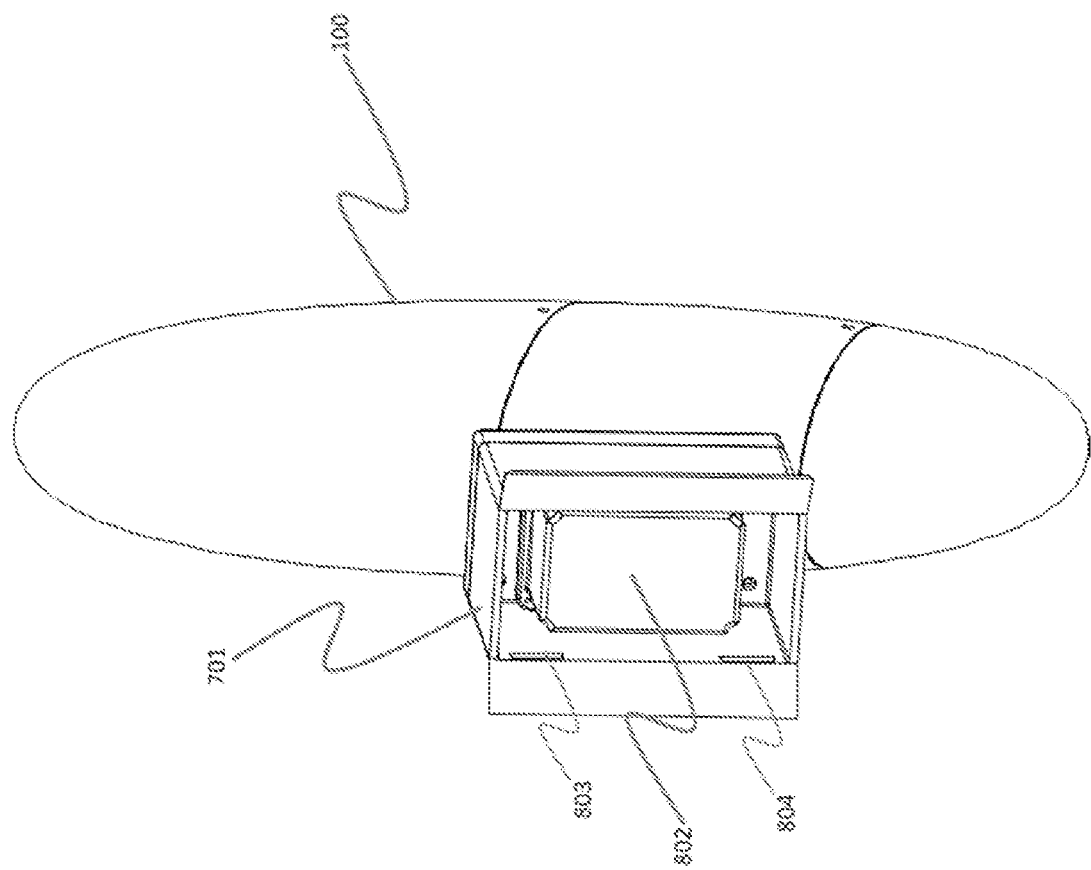
FIG. 10 shows bottom view of the mount shown in FIG. 7 with a power supply visible.

FIG. 9 shows the die cast mount of the mounting subsystem 701, without straps 704, that houses a power converter 802 such as that shown in FIG. 10 is needed on most light utility poles, such as pole 202 of FIG. 8.

FIG. 10 shows a rear view of the optional die cast mount of the mounting subsystem 701, with the covering plate that would normally be covering the opening at rear removed. The die cast mount of the mounting subsystem 701 is shown housing a power converter 802, which is necessary if, for example, there is a need to use main power to power the radio. Then, power converter 802 takes the main power and reduces it to a suitable range for the radio. The power converter is housed in a fireproof enclosure for compliance with regulatory requirements, or the requirements of standards bodies as the Canadian Standards Association (CSA), National Fire Protection Association (NFPA), and the International Organization for Standardization (ISO) or Underwriters' Laboratories (UL). The die cast mount of the mounting subsystem 701 also has openings 803 and 804. Steel straps 704 would pass through openings 803 and 804; and openings 702 and 703; for mounting on pole-like structures such as street lamps and fence posts or other fixed structures.

Figure 10A:
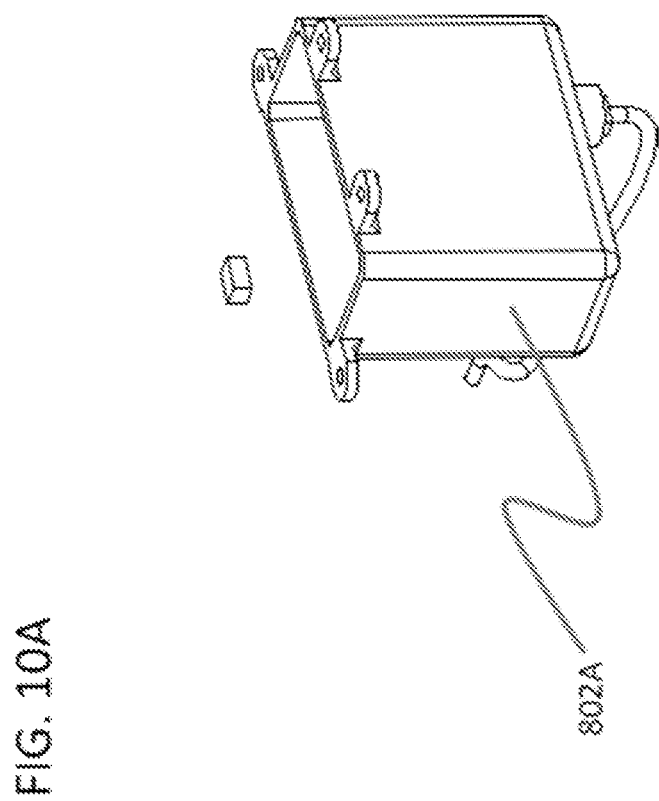
FIG. 10A shows a power supply 802A that is inserted into the mount shown in FIG. 10.

In another embodiment, power supply unit 802A as shown in FIG. 10A can be mounted inside the optional die cast mount 801. Power supply unit 802A can be, for example, a rechargeable or a non-rechargeable battery.

Figure 11:
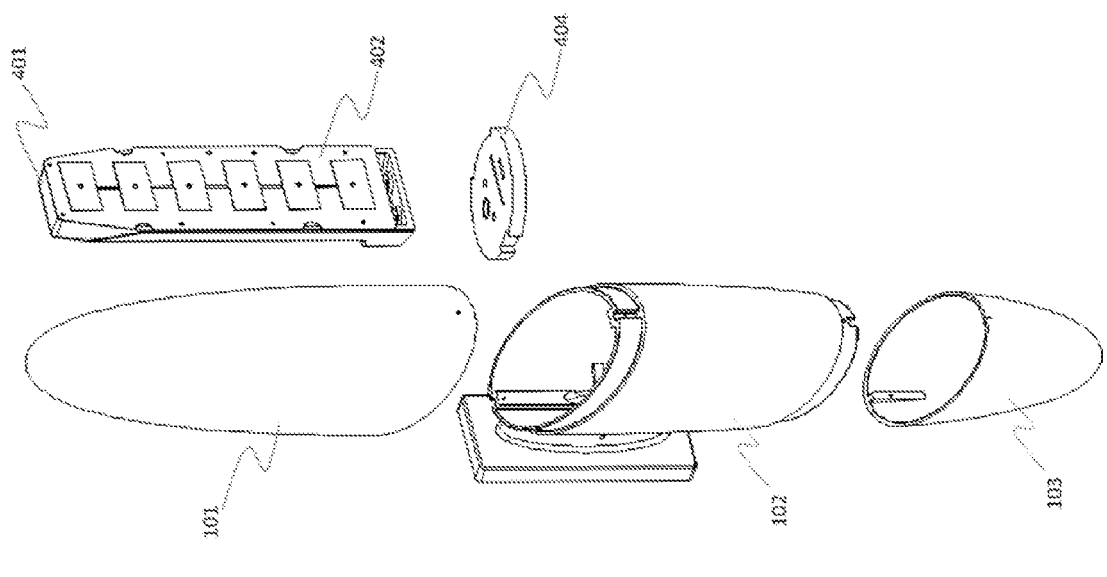
FIG. 11 shows an exploded view of the enclosure with a payload of a radio and antenna with optional lighting.

FIG. 11 shows an exploded view of one embodiment of a fully occupied enclosure 100 with a payload of a radio and antenna. The three sections 101-103 previously described are shown. In addition, the radio printed circuit boards (PCBs) and antenna 402 is included as part of a die cast module 401. The radio and the antenna are arranged in a long thin arrangement versus the traditional square arrangements. In one embodiment, the length to width ratio of the module 401 containing the radio PCB and antenna 402 is between 4:1 and 6:1.

Figure 12:
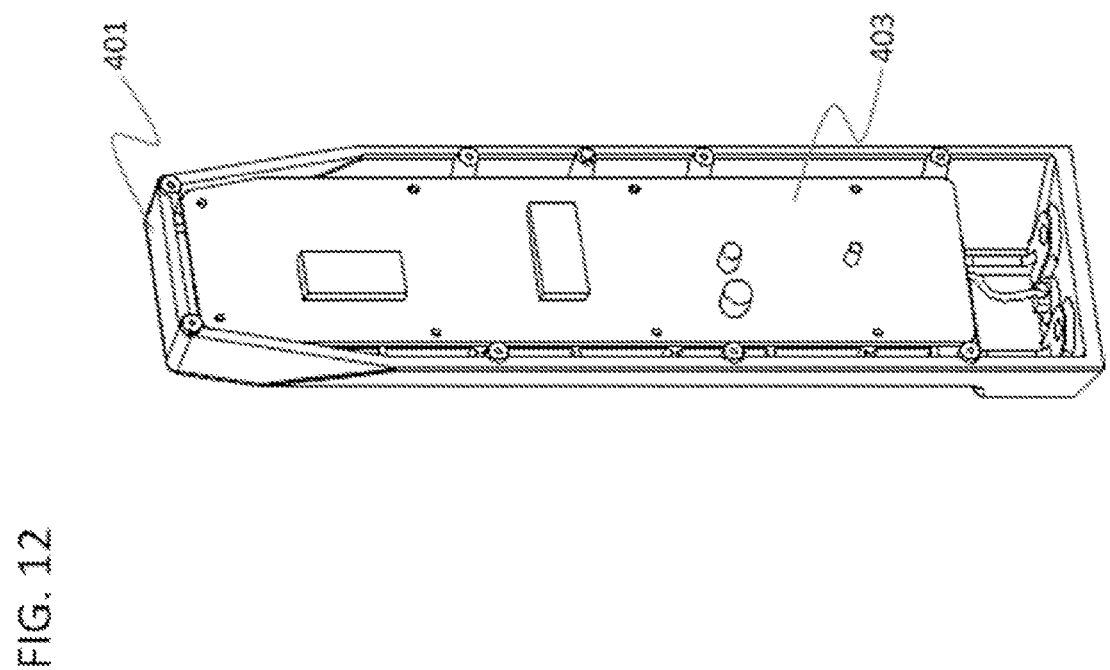
FIG. 12 shows the module 401 with the antenna 402 and metal plate removed, with a radio PCB 403 visible.

The radio PCBs are housed inside the module 401, completely sealed by a metal plate. The antenna 402 is mounted on the outside of that metal plate. The antenna 402 can then be directly coupled mechanically and electrically through the metal plate to the radio PCB 401, thus removing the need for an RF cable to connect the antenna 402 to the radio PCB 401. Such an arrangement can reduce the loss suffered when the signal is transmitted through an RF cable from the antenna to the radio PCB. In addition, in another embodiment, the antenna control circuit can be housed within the assembly and also coupled directly to the antenna through the metal plate. This removes the need for wiring to convey control signals to the antenna. By reducing the amount of wiring required within the enclosure, this reduces the risk of equipment being tangled in wiring when, for example, the antenna is rotated. FIG. 12 shows the module 401 with antenna 402 and metal plate removed with radio PCB 403 visible within.

In another embodiment, the power converter 802 of FIG. 10; or the power supply 802A of FIG. 10A; could also be installed in the main enclosure.

Referring to FIG. 11, module 401 can be connected to rotating assembly 404. With the lower section 103 removed, wiring can be then be connected from main section 102, to a weather proof connector on the bottom of rotating assembly 404. Then, the system is powered up, and the combination of the module 401 and assembly 404 is rotated until the correct angular position is reached. The rotating assembly 404 can then be locked in place to secure radio alignment, and then the lower section 103 can be attached. The cylindrical shape provides a further advantage, as the antenna can be rotated within.

Figure 13:
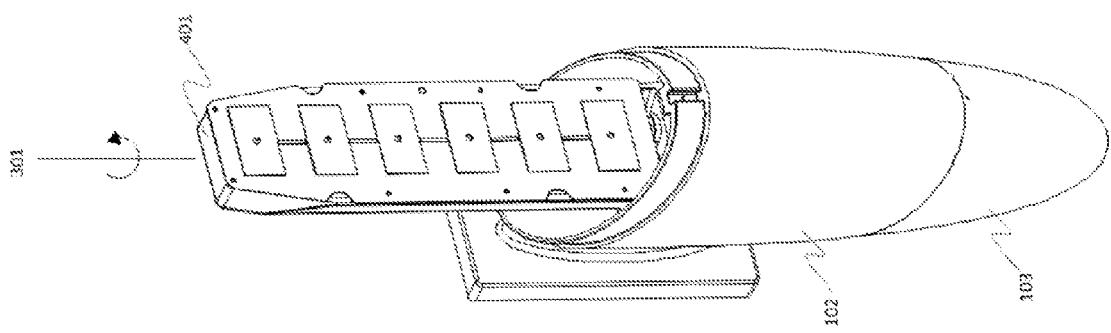
FIG. 13 shows the module 401 pointing forward along an axis passing through the length of the enclosure.
Figure 14:
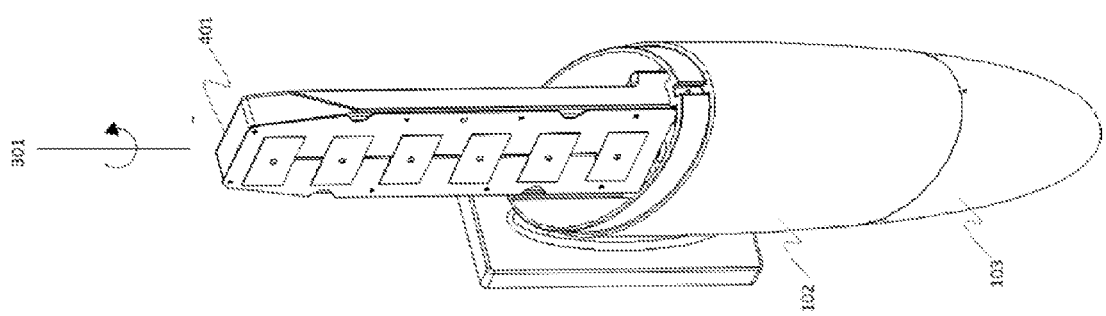
FIG. 14 shows the module 401 after undergoing a 90-degree clockwise rotation about an axis 301 relative to its orientation shown in FIG. 13.
Figure 15:
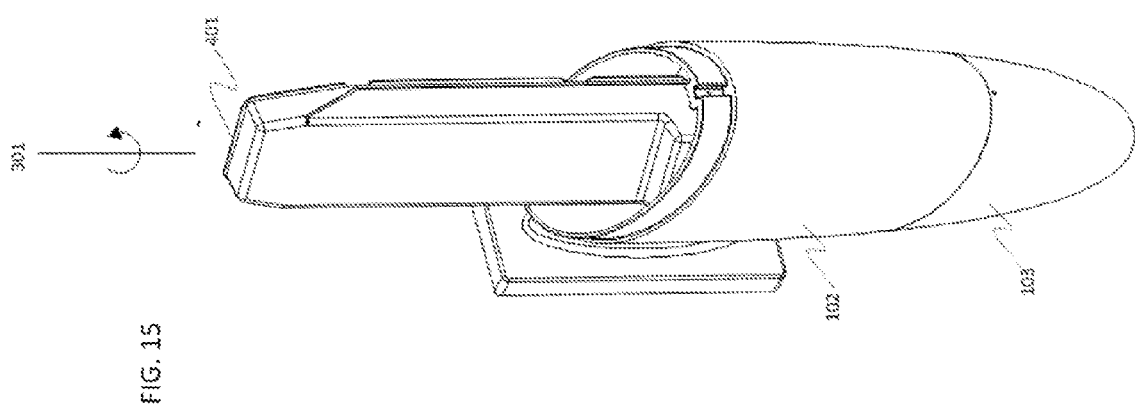
FIG. 15 shows the module 401 after undergoing a 90-degree anti-clockwise rotation about the axis 301 relative to its orientation shown in FIG. 13.

FIGS. 13, 14 and 15 show various angular positions of the module with respect to axis 301 with the top section 101 removed. As shown in FIGS. 13, 14 and 15; the combination of the module 401 and assembly 404 can be rotated about axis 301 by installation technicians. FIG. 13 shows the module 401 pointing forward, that is, with no rotation, and the lower section 103 attached. FIG. 14 shows the module 401 after undergoing a 90-degree clockwise rotation about axis 301, and the lower section 103 attached. FIG. 15 shows the module 401 after undergoing a 90-degree anti-clockwise rotation about axis 301, and the lower section 103 attached. The axis 301 extends along a length L (see FIG. 1) of the enclosure 100 (e.g., along a longest dimension of the enclosure 100).

In one embodiment, to aid an installer the radio PCB 403 has audible feedback (e.g., via a conventional speaker, not shown) and signals the installer when it is correctly aligned. When the desired angular position is reached, an audible signal is heard. The rotating assembly 404 can then be locked in place to secure radio alignment, and then the lower section 103 can be attached.

In another embodiment, the rotating assembly 404 could be connected to a servo motor, which could then be controlled by user input or by a program to be set to an angular position so as to achieve maximum signal strength. Inputs could be sent through either wireless or wired media. Once the final angular position is reached, the rotating assembly 404 can then be locked in place to secure radio alignment, and then the lower section 103 can be attached.

Figure 16:
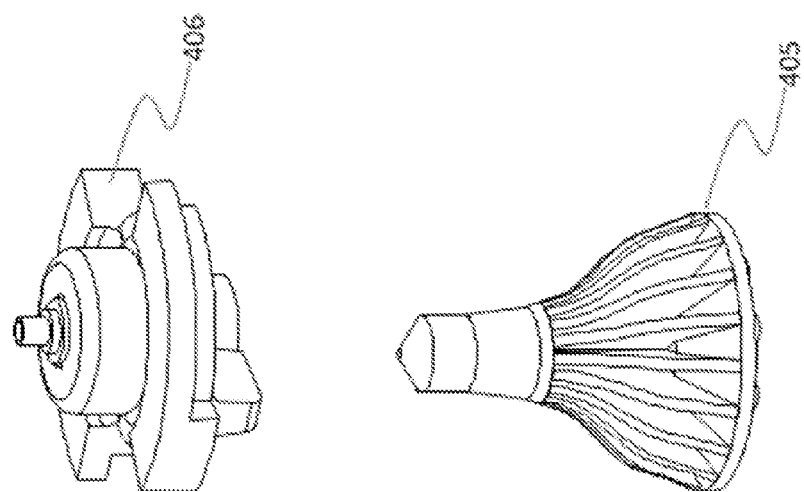
FIG. 16 shows a long life LED 405, together with a mounting plate and socket 406 that can be inserted into the enclosure.
Figure 17:
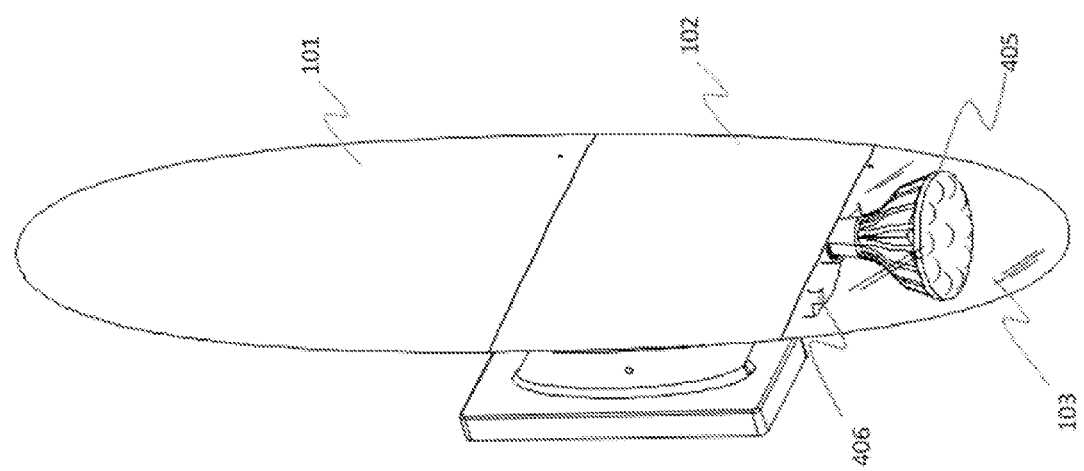
FIG. 17 shows an embodiment of the enclosure with long life LED 405 mounted in a lower section 103 of the enclosure.

As previously detailed, in one embodiment, the payload is only the radio and antenna. In another embodiment, the payload also includes a long life LED light 405 with a corresponding mounting plate and socket 406, as shown in FIG. 16. FIG. 17 shows an embodiment where the long life LED light 405 is installed in lower section 103 with mount 406, pointing downward and used for street lighting. In this embodiment, the lower section 103 is, for example, a clear or frosted lower cone or cylinder.

Figure 18:
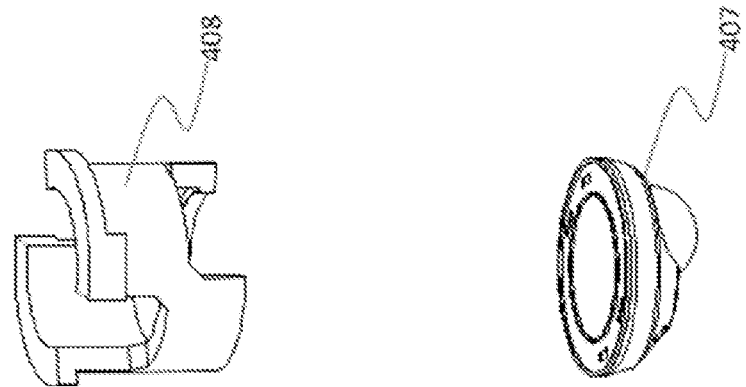
FIG. 18 shows a camera 407 with a rotatable mount 408 that can be inserted into the enclosure.
Figure 19:
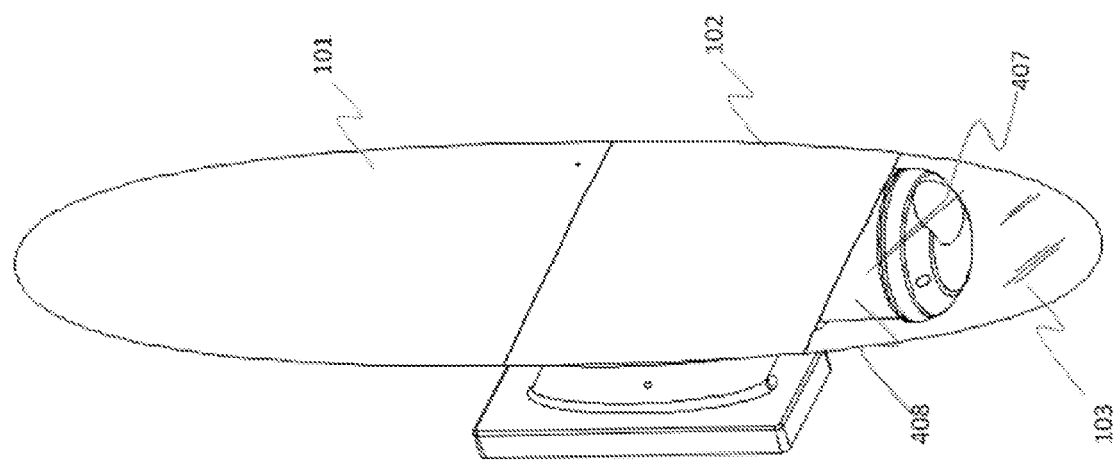
FIG. 19 shows an embodiment of the enclosure with the camera 407 mounted in a lower section 103 of the enclosure.

In yet another embodiment, the payload includes an outdoor camera 407 and rotatable camera mount 408, as shown in FIG. 18. FIG. 19 shows a camera 407 installed with mount 408 in lower section 103 which can be clear, or even a clear lens. Camera 407 can be rotated 360 degrees and pointed upward and downward for optimum video surveillance coverage.

These embodiments have the further advantage of not being recognized as a "standard" security item. They can be mounted pointing in one direction but having the antenna modules pointed in another.

In addition to lights, cameras and security systems; in another embodiment environmental sensor(s) is/are mounted within the lower section 103. These can include, for example, temperature sensors. Other security equipment can be mounted in lower section 103, such as, for example, infra-red sensors. Lower section 103 will then be composed of a suitable material to allow these types of equipment to be used.

These enclosures and payloads can come in different configurations and sizes.

Figure 20:
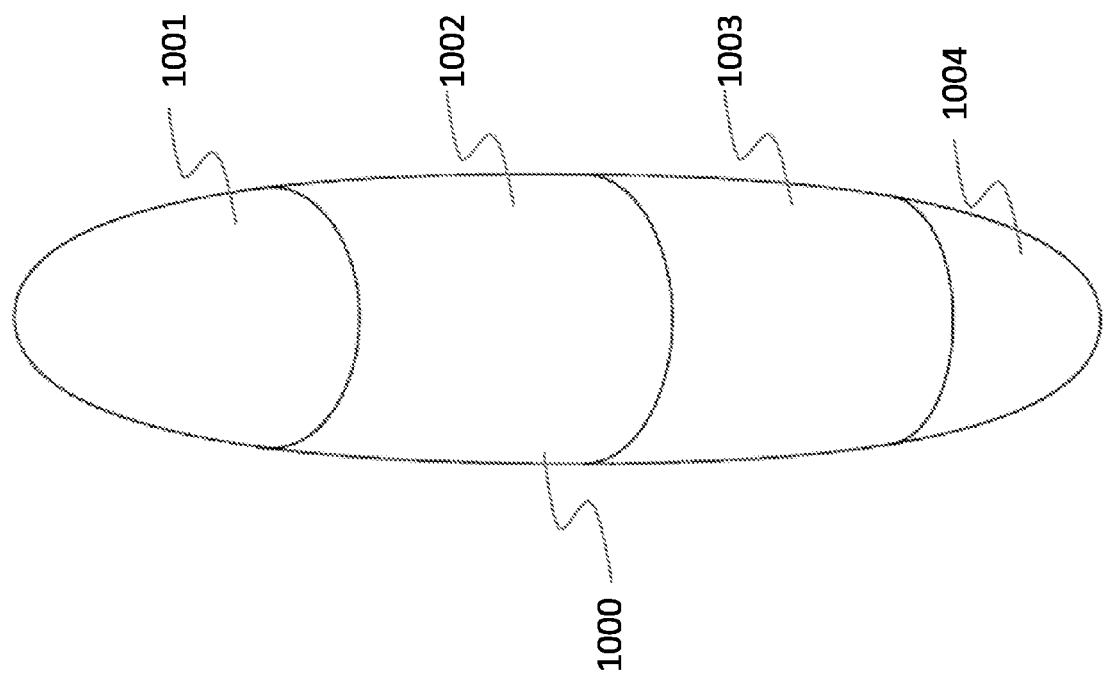
FIG. 20 shows an embodiment of the enclosure with four sections.

As mentioned previously, there may be more than 3 sections. In another embodiment, there is a fourth section, above the RF-transparent top section. FIG. 20 shows an example of such an embodiment 1000 with section 1001, located above and connected to the RF-transparent top section 1002. The embodiment shown in FIG. 20 has two sections below the RF-transparent top section 1002: Main section 1003 and lower section 1004. Main section 1003 and lower section 1004 are similar to main section 102 and lower section 103 of FIG. 1 respectively. At least one of a long life LED light or other lighting system;
environmental sensors, and
a security system
can be installed in section 1001. In the lower section 1004, at least one of
a rotatable camera
environmental sensors,
security equipment and
a lighting system
can be installed.

An embodiment such as embodiment 1000 may serve several purposes, such as:
Illuminating, for example, a sign on a building;
Providing wireless services within an area
Housing security and surveillance equipment

What is claimed is:

1. A radio system comprising:
a radio within an enclosure;
an antenna within the enclosure;
a mounting subsystem mounted to the enclosure and having a hole for receiving wires that connect to a printed circuit board within the enclosure, the printed circuit board including the radio, the antenna being electrically and mechanically connected to the printed circuit board, wherein the enclosure is cylindrical-shaped with tapered ends and has a plurality of sections,
wherein one of the plurality of sections is a main section, the main section of the enclosure is mounted to the mounting subsystem, and
the antenna rotates about an axis that extends along a length of the enclosure;
wherein power to said radio system is supplied by a power supply unit; and
further wherein said power supply unit is either a rechargeable or a non-rechargeable battery.

2. The system of claim 1, wherein the radio and the antenna form a module that rotates about the axis.

3. The system of claim 1, wherein the mounting subsystem comprises a mounting plate for mounting to a fixed structure.

4. The system of claim 3, wherein the mounting plate is connected to a die cast mount.

5. The system of claim 2, wherein the printed circuit board includes an audible feedback device to emit an audible signal responsive to the module being rotated about the axis to a desired angular position.

6. The system of claim 2, where a length to width ratio of the module is between 4:1 and 6:1.

7. The system of claim 1, where at least one of a rotatable camera, environmental sensors, security equipment, or a lighting system is located in the lower section.

8. The system of claim 1, where the wires to the main section are routed through the mounting subsystem so as not to be visible from an exterior of the enclosure.

9. A radio system, comprising:
a module including a radio disposed on a printed circuit board and an antenna connected to the printed circuit board;
an enclosure having at least a main piece coupled to a lower piece and to a top piece and coupled together such that the enclosure forms a cylinder having tapered ends;
a mounting subsystem mounted to the main piece and having a hole to receive therethrough a plurality of wires that connect to the printed circuit board, wherein the antenna rotates about an axis that extends along a longest dimension of the enclosure; and
further comprising at least one of a camera, an environmental sensor, security equipment, or a lighting system located in the lower piece of the enclosure.

10. The system of claim 9, wherein the module includes a metal plate to which the antenna is directly mechanically and electrically coupled without any cable, wherein the plurality of wires lack control signals for controlling the antenna.

11. The system of claim 9, further comprising a lockable rotating assembly coupled to the module, wherein the rotating assembly includes a plate having a major flat surface orthogonal to the axis and a hole through which the wires pass to connect to the module.

12. The system of claim 9, further comprising a lighting system, an environmental sensor, or security equipment located in the top piece of the enclosure.

13. The system of claim 9, wherein power to said radio system is supplied by a main supply, and wherein said radio system comprises a power converter to convert power levels from the main supply to a suitable range for the radio system.

14. A radio system comprising:
a radio within an enclosure;
an antenna within the enclosure;
a mounting subsystem mounted to the enclosure and having a hole for receiving wires that connect to a printed circuit board within the enclosure, the printed circuit board including the radio, the antenna being electrically and mechanically connected to the printed circuit board, wherein the enclosure is cylindrical-shaped with tapered ends and has a plurality of sections;
wherein one of the plurality of sections is a main section; the main section of the enclosure is mounted to the mounting subsystem; and
the antenna rotates about an axis that extends along a length of the enclosure;
wherein power to said radio system is supplied by either a main supply or a power supply unit;
wherein the radio and the antenna form a module that rotates about the axis; and
wherein the printed circuit board includes an audible feedback device to emit an audible signal responsive to the module being rotated about the axis to a desired angular position.

15. The system of claim 14, wherein the mounting subsystem comprises a mounting plate for mounting to a fixed structure.

16. The system of claim 14, where at least one of a rotatable camera, environmental sensors, security equipment, or a lighting system is located in the lower section.

17. The system of claim 16, wherein said power is supplied by the main supply, and further comprising a power converter, wherein said power converter converts power levels from the main supply to a suitable range for the radio.

18. A radio system, comprising:
- a module including a radio disposed on a printed circuit board and an antenna connected to the printed circuit board;
- an enclosure having at least a main piece coupled to a lower piece and to a top piece and coupled together such that the enclosure forms a cylinder having tapered ends;
- a mounting subsystem mounted to the main piece and having a hole to receive therethrough a plurality of wires that connect to the printed circuit board, wherein the antenna rotates about an axis that extends along a longest dimension of the enclosure; and
- further comprising a lighting system, an environmental sensor, or security equipment located in the top piece of the enclosure.

19. The system of claim 18, wherein power to said radio system is supplied by a main supply, and wherein said radio system comprises a power converter to convert power levels from the main supply to a suitable range for the radio system.

20. The system of claim 18, wherein the mounting subsystem comprises a mounting plate for mounting to a fixed structure.

* * * * *